US007880189B2

(12) United States Patent
Kittler et al.

(10) Patent No.: US 7,880,189 B2
(45) Date of Patent: Feb. 1, 2011

(54) DISLOCATION-BASED LIGHT EMITTER

(75) Inventors: Martin Kittler, Frankfurt an der Oder (DE); Manfred Reiche, Halle (DE); Tzanimir Arguirov, Cottbus (DE); Winfried Seifert, Frankfurt an der Oder (DE)

(73) Assignee: IHP GmbH-Innovations for High Performance Microelectronics/ Leibniz-Institut für innovative Mikroelektronik, Frankfurt (DE)

( * ) Notice: Subject to any disclaimer, the term of this patent is extended or adjusted under 35 U.S.C. 154(b) by 212 days.

(21) Appl. No.: 11/919,915

(22) PCT Filed: May 3, 2006

(86) PCT No.: PCT/EP2006/062030
§ 371 (c)(1),
(2), (4) Date: Feb. 24, 2009

(87) PCT Pub. No.: WO2006/117389
PCT Pub. Date: Nov. 9, 2006

(65) Prior Publication Data
US 2009/0321757 A1 Dec. 31, 2009

(30) Foreign Application Priority Data
May 3, 2005 (DE) .................. 10 2005 021 296
Feb. 16, 2006 (DE) .................. 10 2006 008 025

(51) Int. Cl.
*H01L 33/00* (2010.01)
(52) U.S. Cl. ............. 257/98; 257/103; 257/E33.003; 257/E31.095; 438/29; 438/36
(58) Field of Classification Search ............ 257/98, 257/103, E33.003, E31.095; 438/29, 36
See application file for complete search history.

(56) References Cited
U.S. PATENT DOCUMENTS
6,831,302 B2 * 12/2004 Erchak et al. ............... 257/87
(Continued)

FOREIGN PATENT DOCUMENTS
DE 102004042997 12/2006

OTHER PUBLICATIONS
Elsevier; T. Sekiguchi et al.; "Cathodoluminescence study on the title and twist boundaries in bonded silcon wafers"; pp. 244-247; 2002; Materials Science and Engineering B91-92.
(Continued)

*Primary Examiner*—Tu-Tu V Ho
(74) *Attorney, Agent, or Firm*—Ware, Fressola, Van Der Sluys & Adolphson LLP

(57) ABSTRACT

A light-emitting semiconductor component comprising a substrate which has a first interface between a first and a second silicon layer, whose lattice structures which are considered as ideal are rotated relative to each other through a twist angle about a first axis perpendicular to the substrate surface and are tilted through a tilt angle about a second axis parallel to the substrate surface, in such a way that a dislocation network is present in the region of the interface, wherein the twist angle and the tilt angle are so selected that an electroluminescence spectrum of the semiconductor component has an absolute maximum of the emitted light intensity at either 1.3 micrometers light wavelength or 1.55 micrometers light wavelength.

23 Claims, 6 Drawing Sheets

U.S. PATENT DOCUMENTS

2003/0150376 A1   8/2003   Homewood et al. ........... 117/84
2004/0150001 A1*  8/2004   Shchukin et al. ............ 257/183

OTHER PUBLICATIONS

American Institute of Physics; V. Kveder et al.; "Room-Temperature silicon light-emitting diodes based on dislocation luminescence"; pp. 2106-2108; 2004; Applied Physics Letters.

American Institute of Physics; Sveinbjörnsson et al.; "Room temperature electroluminescence from dislocation-rich silicon"; pp. 2686-2688; 1996; Applied Physics Letters, vol. 69, No. 18.

Letters to Nature; W Lg et al.; "An efficient room-temperature silicon-based light-emitting diode"; pp. 192-194; Aug. 3, 2000; School of Mechanical and Materials Engineering; University of Surrey, Guildford, Surrey, GU2 7XH, UK.

Informationsdienst Wissenschaft (Science Information Service); Besse et al.; "IEDM 2005: IHP presents silicon-based light emitter"; Dec. 1, 2005; Brandenburg Technical University of Cottbus; including English Translation.

Kluwer Academic Publishers; T. Akatsu et al.; "Dislocation structure in low-angle interfaces between bonded Si(001) wafers"; pp. 3031-3039; 2004; Journal of Materials Science 39.

* cited by examiner

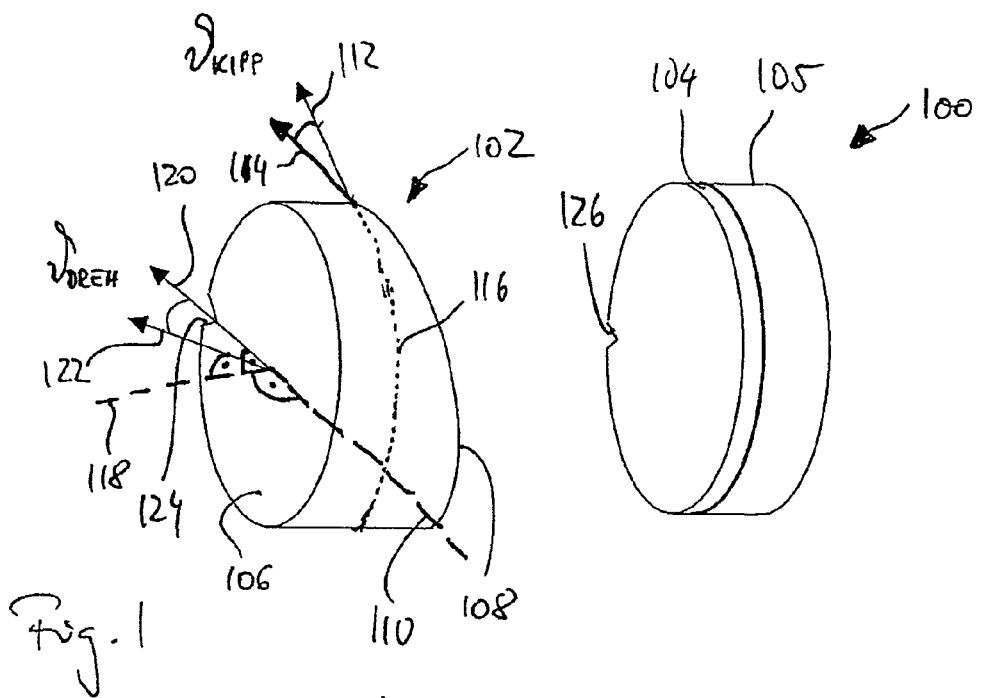
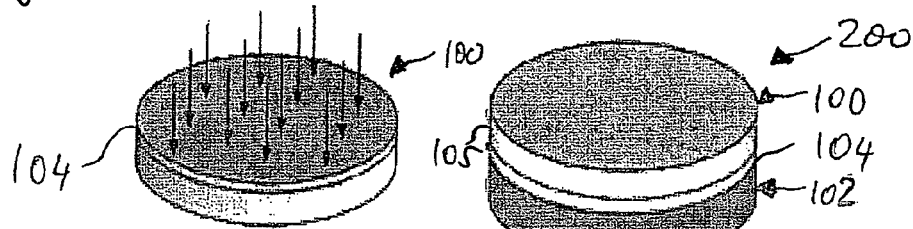
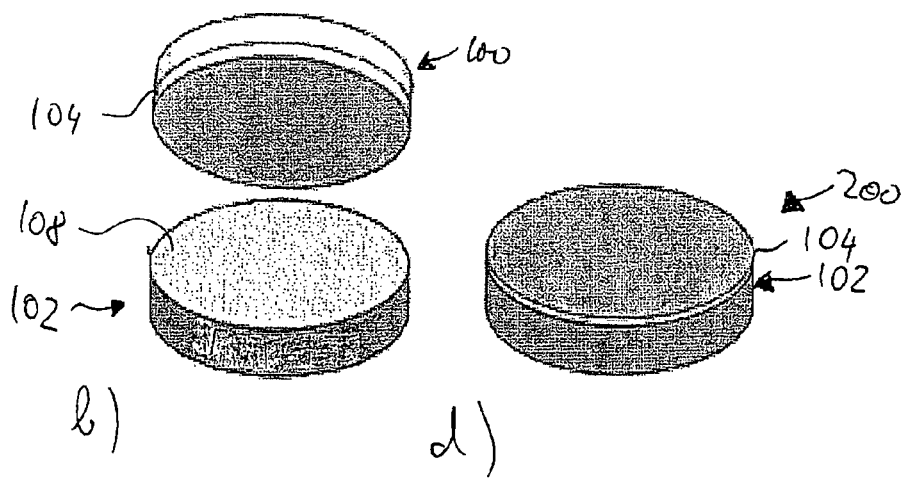
Fig. 1
Fig. 2

DISLOCATION-BASED LIGHT EMITTER

CROSS REFERENCE TO RELATED APPLICATIONS

This application is for entry into the U.S. national phase under §371 for International Application No. PCT/EP2006/062030 having an international filing date of May 3, 2006, and from which priority is claimed under all applicable sections of Title 35 of the United States Code including, but not limited to, Sections 120, 363 and 365(c), and which in turn claims priority under 35 USC §119 to German Patent Application No. 10 2005 008 025.4 filed on Feb. 16, 2006, and German Patent Application No. 10 2005 021 296.4 filed on May 3, 2005.

BACKGROUND OF THE INVENTION

1. Technical Field

The present invention concerns the field of semiconductor components. More particularly, the present invention concerns a silicon-based light-emitting semiconductor component and a process for the production of such a light-emitting semiconductor component.

2. Discussion of Related Art

The development in semiconductor technology is going in the direction of higher integration density of integrated circuits and faster signal processing. Therefore future integrated circuits will probably no longer be based solely on electronic signal production and signal processing, but will increasingly integrate optical and optoelectronic components in order to achieve a further increase in the processing speed and a reduction in the power loss. A further endeavor is to reduce the architectonic complexity by multiplexing of optical signals in waveguides on the chip. Infrared spectral ranges are predestined for optical signal processing.

The base material of semiconductor technology is silicon. Known efficient light-emitting and laser diodes in the infrared spectral range however are not made from silicon but in particular from III-V-semiconductors such as gallium arsenide, indium arsenide or indium gallium arsenide. They can only be integrated into the silicon-based semiconductor technology, in the form of complicated and expensive hybrid processes. Such processes are not given any chances of use.

Silicon has long not been viewed as a suitable base material for light emitters because silicon, in contrast to for example gallium arsenide and many other semiconductor materials, is what is referred to as an indirect semiconductor. In the case of indirect semiconductors the energy minimum of the conduction band states, corresponding to the minimum energy of free electrons, and the energy maximum of the valence band states, corresponding to the minimum energy of free holes, considered as a function of the charge carrier pulse, is not at the same pulse value. As a photon is known to be practically pulse-free pulse production in terms of radiant recombination of free electron-hole pairs must be ensured in silicon by an interaction of the charge carriers with the crystal lattice, more specifically by the production of pulse-affected lattice waves in the form of one of more phonons. The annihilation of a free electron-hole pair with the emission of light therefore requires in silicon the production of a phonon in addition to the desired photon. Such a process has a lower level of probability than the direct production alone of a photon, as occurs in what are referred to as direct semiconductors such as gallium arsenide, in respect of which the energy minima of electrons and holes fall on the same pulse value.

Nonetheless recently efficient silicon-based light-emitters which rely on band-band recombination have been developed, see for example the present applicants' DE 10 2004 042 997 which was not yet published at the filing date of the present patent application.

For optoelectronic use however in particular light emitters in the spectral window around 1.5 μm (about 0.8 eV) or in the spectral window around 1.3 μm (about 0.94 eV) are required. Those spectral regions can be achieved when involving a radiant band-band recombination only with a silicon-germanium alloy with a high proportion of germanium. The low level of defects required for the necessary light yield however can only be implemented with difficulty when using such alloys.

Alternative approaches therefore involve "cultivating" known low-energy light emissions of silicon, which in accordance with the present day state of knowledge, are to be attributed to crystal defects such as dislocations. As the energy levels involved in the light emission are localized at the defects, the energy relaxation processes which lead to light emission can take place without phonon involvement.

The publication by V. Kveder, M. Badylevitch et al., "Room-temperature silicon light-emitting diodes based on dislocation luminescence", Applied Physics Letters, volume 84, number 12, pages 2106-2108 discloses a light-emitting diode which at room temperature exhibits an electroluminescence which is dominated by what is referred to as the D1-line. D1-luminescence in silicon, in accordance with the view prevailing at the present time, is caused by radiant energy relaxation processes at dislocation structures, see T. Sekiguchi, S. Ito, A. Kanai, "Cathodoluminescence study on the tilt and twist boundaries in bonded silicon wafers", Materials Science and Engineering B 91-92 (2002), pages 244-247.

V. Kveder et al. achieve an increase in the efficiency of D1-luminescence at room temperature by the suppression of non-radiant recombination processes which are caused by impurities localized in the surroundings of the dislocations.

A disadvantage of the light-emitting diodes described by Kveder et al. is that their luminescence extends over a relatively wide spectral range and also has a pronounced shoulder at higher energy levels around 0.85 eV. That luminescence is referred to as D2-luminescence. It is however of no interest for optoelectronic uses. The plastically deformed substrates used by Kveder et al. for the production of the light-emitting diodes also suffer from the disadvantage that the irregular dislocation arrangements contained therein, in accordance with the present state of the art, cannot be adequately reproducibly produced.

DISCLOSURE OF INVENTION

The technical object of the present invention is to provide a silicon-based light-emitting semiconductor diode whose light emission has a lesser spectral width in the spectral ranges which are of interest for optoelectronic uses around 1.3 μm or around 1.5 μm.

In accordance with a first aspect of the invention that technical object is attained by a light-emitting semiconductor component comprising a substrate which has a first interface between a first and a second silicon layer, whose lattice structures which are considered as ideal are rotated relative to each other through a twist angle about a first axis perpendicular to the substrate surface and are tilted through a tilt angle about a second axis parallel to the substrate surface, in such a way that a dislocation network is present in the region of the interface, wherein the twist angle and the tilt angle are so selected that an electroluminescence spectrum of the semiconductor component has an absolute maximum of the emitted light intensity at either 1.3 micrometers light wavelength or 1.55 micrometers light wavelength.

Surprisingly it has been found that setting suitable pairs of twist angles and tilt angles provides for the formation of dislocation networks at the first interface, which cause a spectrally limited and intensive luminescence which, depending on the respective pair of angles, is caused quite predominantly by the D1-emission or by the D3-emission. In that respect the D1-luminescence covers the spectral range around 1.55 micrometers and the D3-luminescence covers the spectral range around 1.3 micrometers. By virtue of the suppression of competing radiant energy relaxation processes, which is achieved at the same time, the quantum efficiency of the light emission in the respectively optimized luminescence range, that is to say either in the range of the D1-luminescence or in the range of the D3-luminescence, is increased.

The term "absolute maximum of the emitted light intensity", as regards the intensity comparison with other light emissions, relates to the spectral range between 0.7 and 1.2 eV and therefore embraces the range of the per se known D-luminescences and the light emissions with energies near the band gap energy of silicon of about 1.1 eV. An intensity comparison with light emissions outside that spectral range between 0.7 and 1.2 eV does not play any part in terms of the definition of the light-emitting semiconductor component of the present invention.

Preferred embodiments by way of example of the light-emitting semiconductor component according to the invention are described hereinafter. Insofar as embodiments are not identified as alternative they can be combined with each other.

The choice of a suitable pair of angles plays a great part in terms of implementing the semiconductor component of the present invention. Numerous pairs of angles have been found to be unsuitable, which emphasize the D1-emission or the D3-emission. Preferably the pair of angles is adjusted in such a way that substantially only the D1-emission or substantially only the D3-emission is to be observed in the spectral range between 0.7 and 1.1 eV in the electroluminescence of the semiconductor component. The reference to "substantially" means: minor contributions of other luminescences or of the radiant band-band recombination often cannot be prevented, but do not diminish the usability of a pair of angles in question.

In a first preferred embodiment the twist angle is between 1.1° and 1.5° and the tilt angle is between 0.6° and 0.7°. In that way a dislocation network is afforded at the first interface, which causes spectrally limited and intensive luminescence which is quite predominantly caused by the D1-emission.

The light-emitting semiconductor component of this embodiment makes it possible to markedly emphasize the D1-emission with respect to the D2 through D4-emissions and with respect to the band-band emission line at 1.1 eV. The spectral width of the electroluminescence of the semiconductor component is markedly reduced in that way. In addition, the quantum efficiency of the light emission in the range of the D1-luminescence is increased by virtue of the suppression of competing radiant energy relaxation processes.

Preferred embodiments by way of example of the light-emitting semiconductor component according to the invention are described hereinafter.

Preferably the twist angle is 1.3°.

Further preferably the tilt angle is 0.64°.

In a particularly preferred embodiment the twist angle is 1.3° and the tilt angle is 0.64°. In that case the first and second silicon layers are preferably formed by two silicon wafers with (100)-surfaces. In accordance with the present day manufacturing technology the twist angle and the tilt angle can be produced and determined with a degree of accuracy of at least 0.1°. In principle it is also conceivable to use silicon wafers other than (100)-oriented silicon wafers, for example (111)- or (010)-oriented silicon wafers. At the present time however there is not yet any experience therewith.

In an alternative embodiment the twist angle is between 8.9° and 9.1° and the tilt angle is between 0.1° and 0.3°. With that embodiment it is also possible to produce a dislocation network at the first interface which causes intensive luminescence caused predominantly by the D1-emission. Preferably the twist angle is 9.0°. Further preferably the tilt angle is 0.2°. Particularly preferably the twist angle is 9.0° and the tilt angle is 0.2°.

In a further alternative embodiment the twist angle is between 8.1° and 8.3° and the tilt angle is between 0.1° and 0.3°. It is possible with that embodiment to produce a dislocation network at the first interface, with which a spectrally limited and intensive luminescence can be produced, which is quite predominantly caused by the D3-emission.

It is to be expected that further pairs of values in respect of twist angles and tilt angles exist, which provide that the electroluminescence spectrum of the light-emitting semiconductor component has an absolute maximum at the D1-emission or the D3-emission.

In regard to the intensity of the D1-light emission, it has proven to be advantageous if slight decoration of the dislocation network with oxygen is involved.

The surfaces are preferably connected by means of a wafer bonding process. Numerous established processes for the production of dislocations admittedly exist. By way of example dislocation networks can be produced by means of plastic deformation, see the works by Kveder referred to hereinbefore. An alternative involves the production of misfit dislocations upon the deposit of layers with different lattice constants, such as for example silicon-germanium layers on a silicon substrate. Dislocation networks can also be produced by the implantation of ions and subsequent curing steps. In that respect perfect or non-perfect dislocation loops are produced, or rod-like dislocations or defects. All those processes however suffer from the disadvantage that they cannot be controlled and reproduced with the required precision. Wafer bonding has the advantage over those processes that the twist and tilt angles can be precisely set and in that way particularly regular and well-reproducible dislocation networks can be produced.

As the inventors were able to establish in extensive investigations in conformity with the known specialist literature, just relatively minor changes in the twist and tilt angles already have great effects on the dislocation structures produced thereby and on the light emissions they cause in the range of the luminescences D1 through D4.

Preferably the second axis which defines the tilt of the first and second silicon layers relative to each other is parallel or approximately parallel to a <110>-direction of the wafer.

Preferably the first interface between the first and second silicon layers is at a depth of between 100 and 300 nm beneath the surface of the substrate of the light-emitting semiconductor component. A spacing relative to the substrate surface of 200 nm is particularly preferred. This embodiment is advantageously produced by shallow implantation simultaneously with the formation of source and drain regions of field effect transistors on the same chip.

In an alternative embodiment the first interface is arranged at a spacing of more than 200 nm from the substrate surface.

In this case the doping of p- and n-regions is preferably effected in conjunction with well doping.

It will be appreciated however that it is also possible to provide separate doping steps for the production of the p- and n-doped regions of the semiconductor component. Further details of doping are described in connection with the description of a preferred embodiment with reference to FIG. 2.

In a further embodiment the efficiency of D1-emission or D3-emission is further increased by the substrate including two or more interfaces at which a corresponding dislocation network is formed. By virtue of the complexity of manufacture, a semiconductor component with two influences is preferred, wherein the second silicon layer at its side remote from the first silicon layer forms with a third silicon layer a second interface at which the second and third silicon layers are rotated relative to each other through a second twist angle and are tilted through a second tilt angle, in such a way that a dislocation network is present in the region of the second interface, wherein the second twist angle and the second tilt angle are so selected that an electroluminescence spectrum of the semiconductor component from the region of the second dislocation network has an absolute maximum of the emitted light intensity at either 1.3 micrometers light wavelength or 1.55 micrometers light wavelength.

In a particularly preferred feature the third silicon layer is also formed by a (100)-silicon wafer with a <110>-direction of the second axis.

In various alternative embodiments the second twist angle is between 1.1° and 1.5° and the second tilt angle is of 0.6° and 0.7°, or the second twist angle is between 8.9° and 9.1° and the second tilt angle is between 0.1° and 0.3°, or the second twist angle is between 8.1° and 8.3° and the second tilt angle is between 0.1° and 0.3°. The provision of two or more interfaces with dislocation networks involving the same twist and tilt angles can therefore markedly increase the intensity of light emission from the semiconductor component according to the invention. It is also conceivable for the first interface to be optimized for a D1-emission and for the second emission to be optimized for a D3-emission. That affords a light emission which has two separate, relatively narrow-band electroluminescence maxima. By virtue of suitable electrical or optical measures, it can be made possible to use only one of the two emissions. The light-emitting semiconductor component with two emission peaks in the ranges which are of spectral interest of 1.3 micrometers and 1.55 micrometers could be flexibly used.

A preferred embodiment of the light-emitting semiconductor component has an n-doped portion and a p-doped portion adjoining same. They are preferably arranged relative to the first interface or the first and second interfaces in such a way that the dislocation network, or the dislocation networks when there are a plurality of interfaces, lies or lie outside a barrier layer which is formed at forward polarity of the semiconductor component. In that way a high concentration of excess charge carriers can be achieved in the light-emitting region at the dislocation networks near the interfaces. In an alternative embodiment there are provided an n-doped portion and a p-doped portion adjoining same, which are so arranged relative to the first interface or the first and second interfaces that the dislocation network or networks lie within a barrier layer formed upon forward polarity of the semiconductor component.

In a further embodiment of the light-emitting semiconductor component the substrate surface has at least two surface portions of which a first surface portion is disposed on a first side relative to the first interface and a second surface portion is disposed on a second side relative to the first interface. At least one respective contact element is arranged on the first and second surface portions. In this embodiment it is possible to achieve an increase in the intensity of light emission from the dislocation region by applying a bias voltage to the contact elements on the two surface portions of the substrate surface. Preferably the contact elements are ohmic contact elements. The level of the bias voltage to be selected for an improvement in the level of emission intensity depends on the doping, the sign thereof can be selected to be any sign.

Preferred embodiments of the light-emitting semiconductor component of the present invention are in the form of a light-emitting diode or a laser diode. That includes in particular suitable contacting of the p- and n-regions, which contacting can be applied in accordance with familiar methods. As is known the manufacture of a laser diode requires the additional provision of a resonator, which is achieved for example by mirror-coating of the substrate edges or alternatively the substrate surfaces.

A further aspect of the invention involves the use of a silicon substrate which has a first interface between a first and a second silicon layer, whose lattice structures which are considered as ideal are rotated relative to each other through a twist angle about a first axis perpendicular to the substrate surface and are tilted through a tilt angle about a second axis parallel to the substrate surface, in such a way that a dislocation network is present in the region of the interface, wherein the twist angle and the tilt angle are so selected that an electroluminescence spectrum of the semiconductor component has an absolute maximum of the emitted light intensity at either 1.3 micrometers light wavelength or 1.55 micrometers light wavelength, for the production of a light-emitting semiconductor component.

In preferred embodiments of the use according to the invention the silicon substrate has the additional features of one of the above-described embodiments of the light-emitting semiconductor component.

BRIEF DESCRIPTION OF THE DRAWINGS

Further details and embodiments by way of example of the present invention are described hereinafter with reference to the Figures in which:

FIG. 1 shows a perspective view of two silicon wafers to describe the geometrical conditions in the wafer bonding process, FIG. 2 in four sub-Figures a) through d) shows essential process steps in the production of the substrate for an embodiment of a light emitter according to the invention.

DETAILED DESCRIPTION

Figure 3:
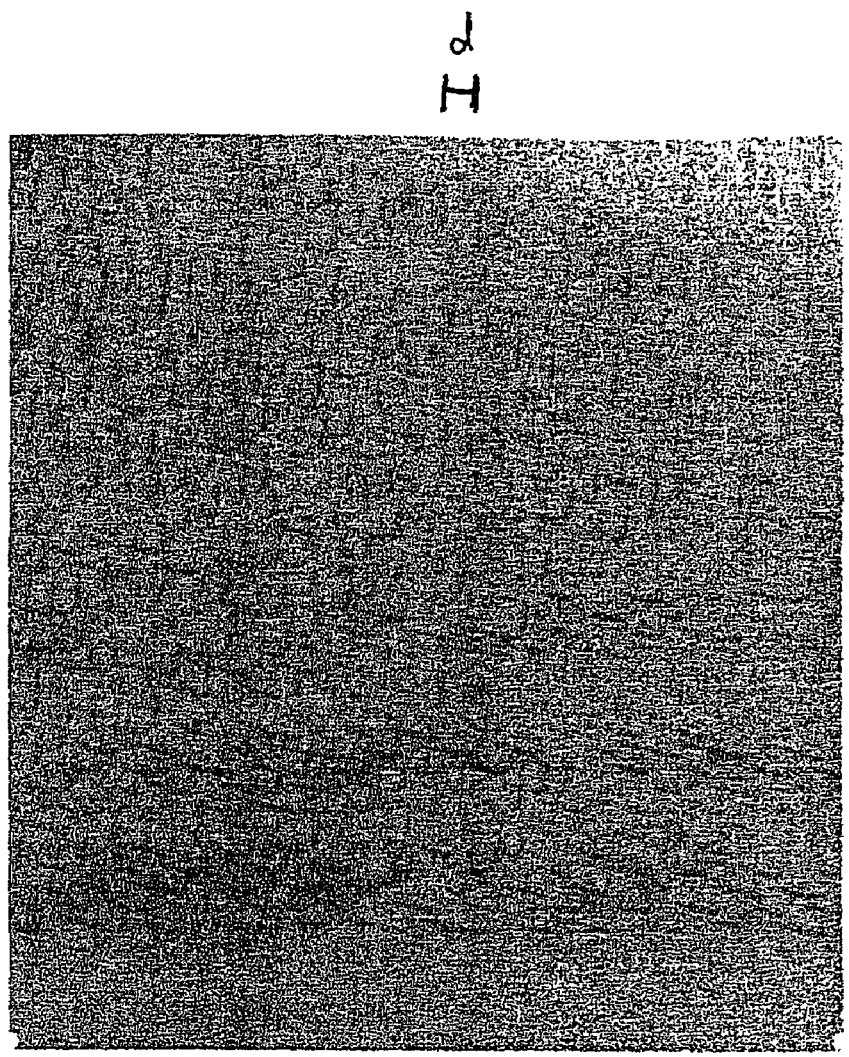
FIG. 3 shows a transmission electron microscopic recording of a dislocation network in a light emitter according to the invention.

FIG. 1 is a diagrammatic three-dimensional view showing two wafers 100 and 102 which are used for the production of the substrate of a light emitter according to the invention.

The wafer 100 is a (100)-silicon wafer into which hydrogen ions or helium ions are introduced by a hydrogen implantation step with a dose of between $1 \times 10^{16}$-$1 \times 10^{17}$ cm$^{-2}$. The implanted layer 104 extends over a depth of about 200 nm from the substrate surface.

The wafer 102 is also a (100)-silicon wafer. Unlike the wafer 100 however its two surfaces 106 and 108 are not parallel to each other but tilted relative to each other through a small angle $\theta_{KIPP}$. That angle is referred to as the "tilt". The axis about which the surface 108 is tilted relative to the surface 106 is parallel to the <110>-direction and is indicated by a broken line 110. The angle $\theta_{KIPP}$ between an arrow 112 extending parallel to the surface 106 and an arrow 114 extending parallel to the surface 108 is shown for the sake of clarity. A dotted line 116 for comparison indicates the configuration of the lower edge of the wafer 102 in the notional case in which both surfaces 106 and 108 would be parallel to each other. The view in FIG. 1 is greatly exaggerated in order to be able to clear show the geometrical situation involved.

In addition an axis of rotation which is perpendicular to the substrate surface 106 is shown by a broken line 118. In the wafer bonding process the wafer 100 and the wafer 102 are rotated relative to each other through a defined angle $\theta_{DREH}$ about the axis of rotation 118. That rotation can be referred to as the "twist". Two arrows 120 and 122 serve to indicate the different orientations of the wafers 100 and 102 in the wafer bonding process, wherein the arrow 120 points in the <110>-direction which is additionally shown on the wafers 100 and 102 by notches 124 and 126.

In the embodiment of the invention which is preferred at the present time the twist angle $\theta_{DREH}$ is 1.3° and the tilt angle $\theta_{KIPP}$ is 0.64°. The angle values relate to a scale between 0 and 360°. It is to be assumed however that further combinations of twist and tilt angles lead to a similar narrow and intensive light emission in the range of the D1-luminescence.

FIG. 2 shows essential process steps in the production of the substrate of a light emitter according to the invention.

In the description hereinafter reference is made to the two wafers 100 and 102 in FIG. 1. In the first process step shown in FIG. 2a) hydrogen is implanted into the wafer 100 with a dose of $1 \times 10^{16}$-$1 \times 10^{17}$ cm$^{-2}$ in order to produce the layer 104 near the surface. That is symbolically indicated in FIG. 2a) by arrows directed onto the wafer surface. The layer 104 near the surface is separated from the rest of the substrate 100 in a later process step, the result of which is shown in FIG. 2d) (this is referred to as "smart-cut" process).

In the process step shown in FIG. 2b) the prepared wafer 100 is applied with the surface layer 104 lowermost to the wafer 102, the surface 108 of which comes into contact with the layer 104. By virtue of surfaces which are clean and smooth in atomic dimensions the substrates 100 and 102 adhere to each other, intermolecular forces such as van der Waals forces or hydrogen bonds providing the adhesion. The adhesion is reinforced by a subsequent temperature treatment of the substrate 200 produced in that way. At the same time the layer 105 is split from the substrate 200 by means of a smart-cut process. FIG. 2d) shows as the result the substrate 200 which is prepared in that way and which is formed from the wafer 102 and the layer 104 of the wafer 100.

A configuration involving p- and n-doped regions is required for the production of a light-emitting diode or a laser diode. Those process steps are not specifically shown in FIG. 2. In the embodiment set forth here, with a depth of the interface of about 200 nm, a shallow p- or n-doping is preferably introduced into the layer 104 before the wafer bonding process is carried out. In that respect the additional doping with hydrogen and/or helium for carrying out the smart-cut process does not represent an impediment in regard to producing a desired doping profile.

After the smart-cut process has been carried out in the stage shown in FIG. 2d) a further doping step of opposite charge carrier type is carried in order to produce a pn-junction. In that respect the dose, energy and parameters of the thermal post-treatment are so adjusted that the barrier layer produced in the forward polarity is above the interface in relation to the substrate 102. In that respect the substrate 102 is of the same conductivity type as the doping portion of the layer 104, that is nearer to the interface.

The above-described doping process provides for the formation of the pn-junction above the interface, that is to say in the layer 104. The pn-junction however can also be produced in the substrate 102. In that case either the substrate 102 is produced with the required p-conductivity and/or it is subsequently subjected to a doping step of the desired conductivity type. Then, prior to the wafer bonding step, further doping involving the opposite conductivity type is effected. In that case the energy, dose and parameters of the subsequent thermal post-treatment of the substrate 102 are so adjusted that the barrier layer which is formed in the forward polarity is at the desired depth beneath the interface in the substrate 102.

Alternatively the last-mentioned doping operation can also be carried out after the wafer bonding step, in which case the implantation parameters must be appropriately adapted. In this last variant doping of the layer 104 is preferably effected after the wafer bonding operation. It is however also possible for that layer to be doped prior to the wafer bonding operation.

In an alternative embodiment the interface between the layer 104 and the layer 102 is at a spacing from the substrate surface, which is greater than 200 nm. The smart-cut process described can also be used in this variant. However, alternative processes are also known, which permit separation of the substrate 100 from the layer 104. Accordingly the layer 104 can be produced in any thickness, whereby the interface is of a freely selectable depth in relation to the substrate 102. It is for example conceivable that, depending on the respective doping profile, a larger spacing of the barrier layer from the interface with the dislocation network has a positive influence on the excess charge carrier concentration and thus on the intensity or quantum efficiency of light emission.

FIG. 3 shows a transmission electron microscopic recording of a dislocation network at the interface between the layer 104 and the wafer 100 of the substrate 200. It is possible to see a regular pattern of dislocation lines which are contrasted dark in relation to the background and which are at a spacing d of about 20 nm from each other. The dislocation network shown in FIG. 3 is produced using a twist angle $\theta_{DREH}$ of 1.3° and a tilt angle $\theta_{KIPP}$ of 0.64°.

Figure 4:
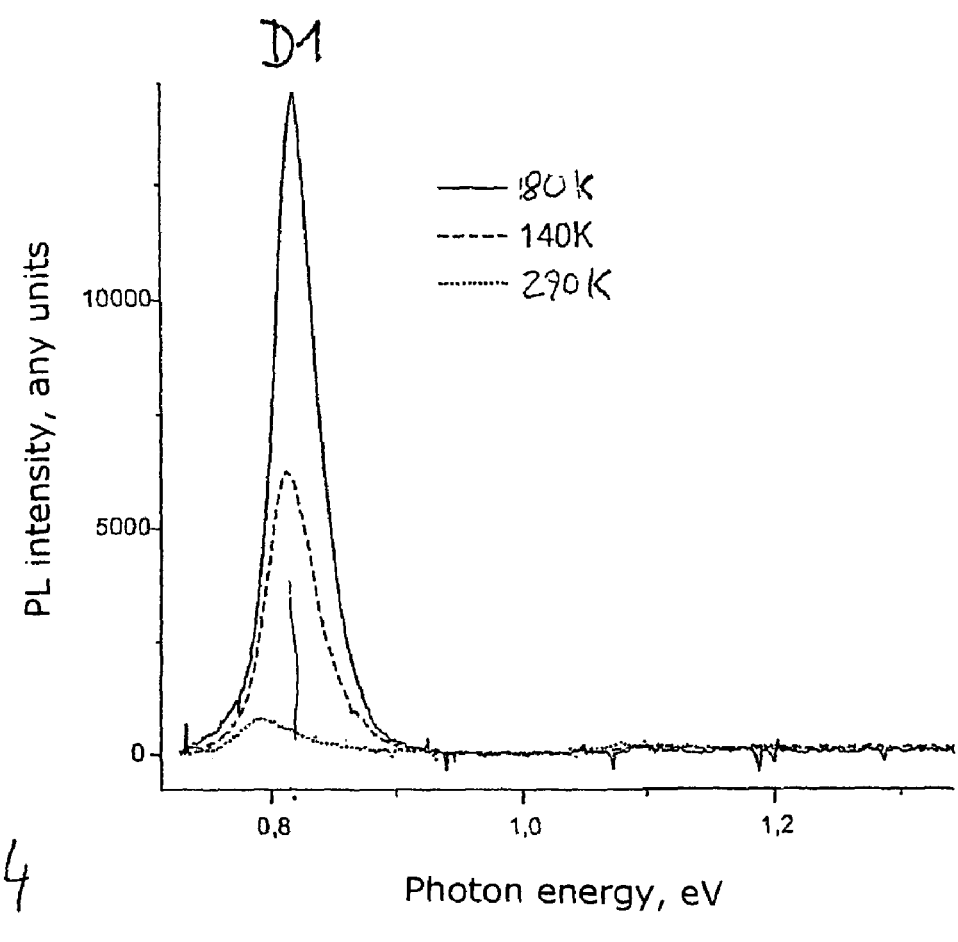
FIG. 4 shows photoluminescence spectra of a light emitter according to the invention at different temperatures.

FIG. 4 shows photoluminescence spectra of the substrate 200 upon excitation with light of an energy above the band edge of silicon. The Figure shows three photoluminescence spectra in the spectral range between about 0.75 eV and 1.3 eV. A spectrum illustrated with a solid line was recorded at a substrate temperature of 80 K. A spectrum identified by a broken line was recorded at a substrate temperature of 140 K. A spectrum illustrated by a dotted line was recorded at a temperature of 290 K. In each case the photoluminescence intensity is shown in any linear units as a function of the energy of the emitted photons. It can be clearly seen that the luminescence spectrum at all three temperatures investigated has only a single clearly discernible luminescence peak which can be unequivocally identified as D1-luminescence on the basis of its energetic position. The maximum of the D1-luminescence at room temperature is at an energy of just below 0.8 eV, that is to say precisely in the spectral range which is of particular interest for optoelectronic uses. At room temperature the luminescence spectrum exhibits an extremely slight asymmetry in respect of the line form, which points to only minimal contributions of the D2-luminescence to the light emission. At lower temperatures the D2-luminescence is not perceptible.

It is also noticeable that band-band recombination does not noticeably contribute to the luminescence of the substrate. Conventional doping and contacting processes make it possible to produce from the substrate 200 an efficient light-emitting diode which exhibits a comparatively narrow-band and intensive light emission at 1.5 µm. Such a light-emitting diode can be incorporated directly into silicon-based semiconductor technology. In that case the pn-junction is preferably arranged in such a way that the dislocation network, or the dislocation networks when there are a plurality of interfaces, lies or lie outside a barrier layer which is formed in forward polarity of the semiconductor component.

It is also possible to see from the view in FIG. 4 that the intensity of the D1-luminescence decreases with temperature. That behavior is typical for numerous defect luminescences in semiconductors and is not a hindrance in terms of the operation of a light-emitting or laser diode.

The maximum of the D1-luminescence is about 0.36 eV below the energy of the band gap of silicon. That spacing also remains constant with increasing temperature, at which, as is known, the energy of the band gap falls.

Figure 5:
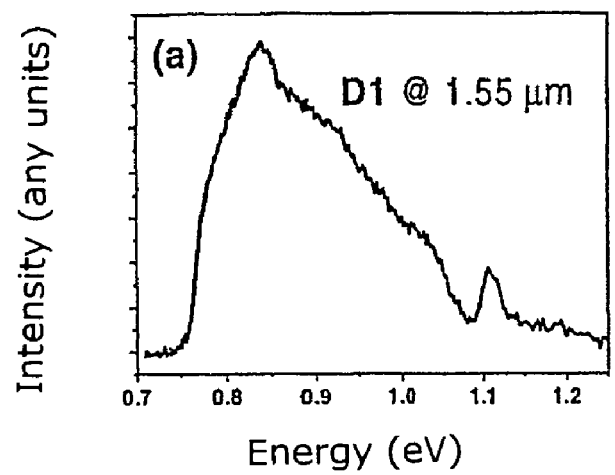
FIG. 5 shows luminescence spectra of two further dislocation networks with alternative pairs of angles.
Figure 5:
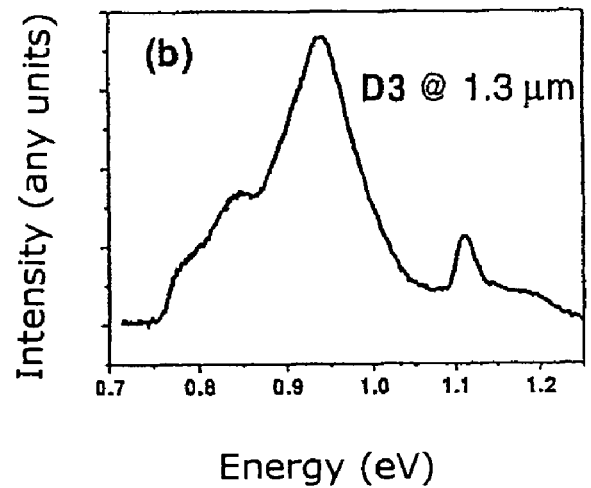

FIG. 5 shows luminescence spectra of two further dislocation networks with alternative pairs of angles. FIG. 5a) shows a luminescence spectrum of a dislocation network which is produced by setting a twist angle of 9° and a tilt angle of 0.2°. The spectrum was recorded at a temperature of 80 K. At that angle also the D1-luminescence dominates, even if not as clearly as in the case of the example of FIG. 4.

FIG. 5b) in contrast shows a luminescence spectrum of a dislocation network which is produced by setting a twist angle of 8.2° and a tilt angle of 0.2°. Here the D3-emission dominates the luminescence spectrum recorded at 80 K. Contributions from other luminescences such as for example the D1-emission and the band-band emission are comparatively slight. With that angle combination therefore it is possible to produce a light-emitting semiconductor element which emits predominantly at 1.3 micrometers light wavelength.

Figure 6:
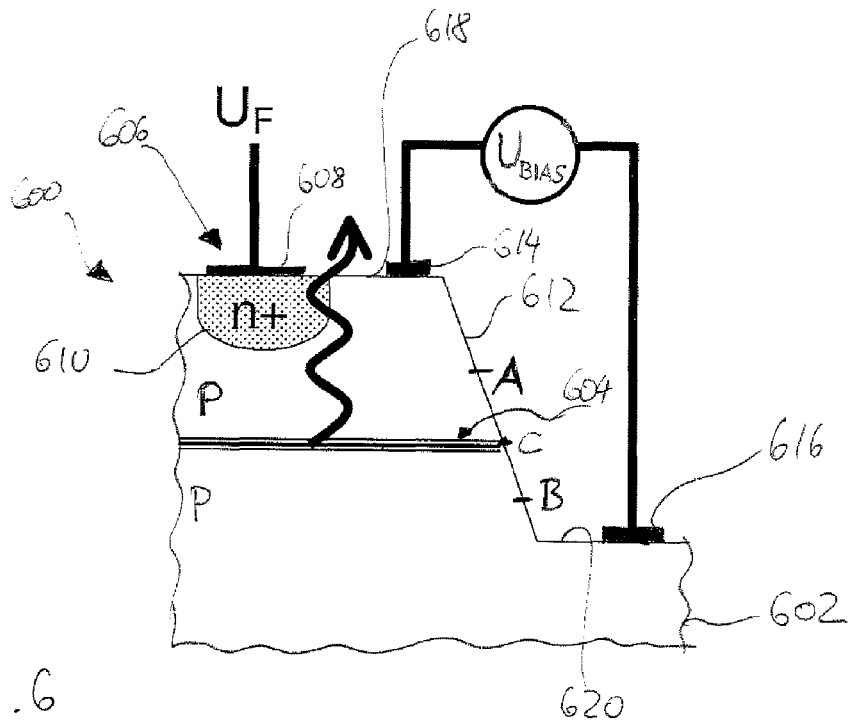
FIG. 6 shows a diagrammatic cross-sectional view of a further embodiment of a light-emitting semiconductor component according to the invention.

FIG. 6 shows a diagrammatic cross-sectional view of a further embodiment of a light-emitting semiconductor component according to the invention. A light emitter 600 has a substrate 602 which includes a first interface 604 which is produced using the process described with reference to FIGS. 1 and 2. A control connection 606 serves for applying an operating voltage $U_F$ in the forward polarity of a diode structure which is formed by an n-doped region 610 and a first silicon layer 612 of the substrate 602. The substrate 602 is p-doped in the present embodiment.

There are also contact elements in the form of bias voltage contacts 614 and 616, between which a bias voltage $U_{BIAS}$ can be applied. The first bias voltage contact 614 is arranged on a first surface portion 618 of the substrate surface, which is above the interface 604. The second bias voltage contact 616 is arranged on a second surface portion 620 of the substrate surface of the substrate 602, which is beneath the interface 604.

In operation of the light emitter 600 the application of a suitable operating voltage $U_F$ in the forward polarity direction causes charge carriers to be injected from the n$^+$-doped region 610 into the substrate interior, and they reach the interface 604 at which, as already explained, light emissions take place and lead to outwardly visible light radiation. The intensity of the light radiation can be increased by applying a suitable voltage $U_{BIAS}$. A suitable bias voltage $U_{BIAS}$ is for example 2V. The magnitude of the bias voltage should be selected in dependence on the doping. In previous tests it was found that the polarity of the bias voltage plays no part in regard to the effect of increasing the light intensity. It is assumed at the present time that the increase in light emission from the dislocation region at the interface 604 is due to the fact that dislocation-induced states, with energy levels in the band gap of the semiconductor material, undergo a charge change upon application of the bias voltage $U_{BIAS}$, which increases the recombination probability.

Figure 7:
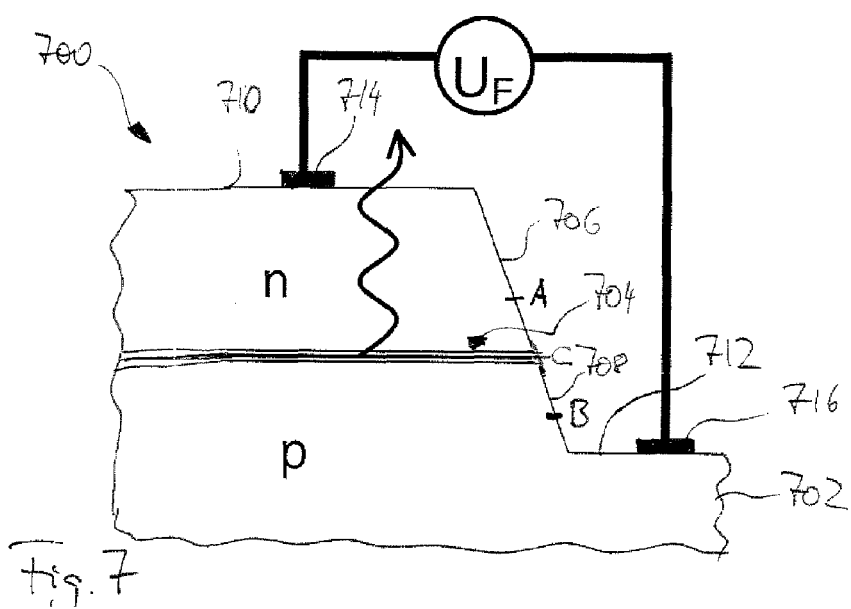
FIG. 7 shows a diagrammatic cross-sectional view of a further embodiment of a light-emitting semiconductor component according to the invention.

FIG. 7 shows an alternative embodiment of a light emitter 700 with a substrate 702 and an interface 704 between two silicon layers 706 and 708, which is also produced by a process corresponding to the production process described with reference to FIGS. 1 and 2. In the light emitter 700 the first semiconductor layer 706 is n-doped and the second semiconductor layer 708 is p-doped. Similarly to the light emitter 600 in FIG. 6, the light emitter 700 has a substrate surface having two surface portions 710 and 712. A contact element 714 is arranged on the first surface portion 710 and a contact element 716 is arranged on the second surface portion 712. Once again the first contact element 714 is arranged above the interface 704 and the second contact element 716 is beneath the interface 704.

The structure shown in FIG. 7, upon application of an operating voltage $U_F$ in the forward polarity, also makes it possible to excite a level of light intensity, which is increased in comparison with conventional arrangements, from the region of the interface 704. It will be appreciated that the doping of the silicon layers 706 and 708 of the substrate 702 can also be reversed.

Figure 8:
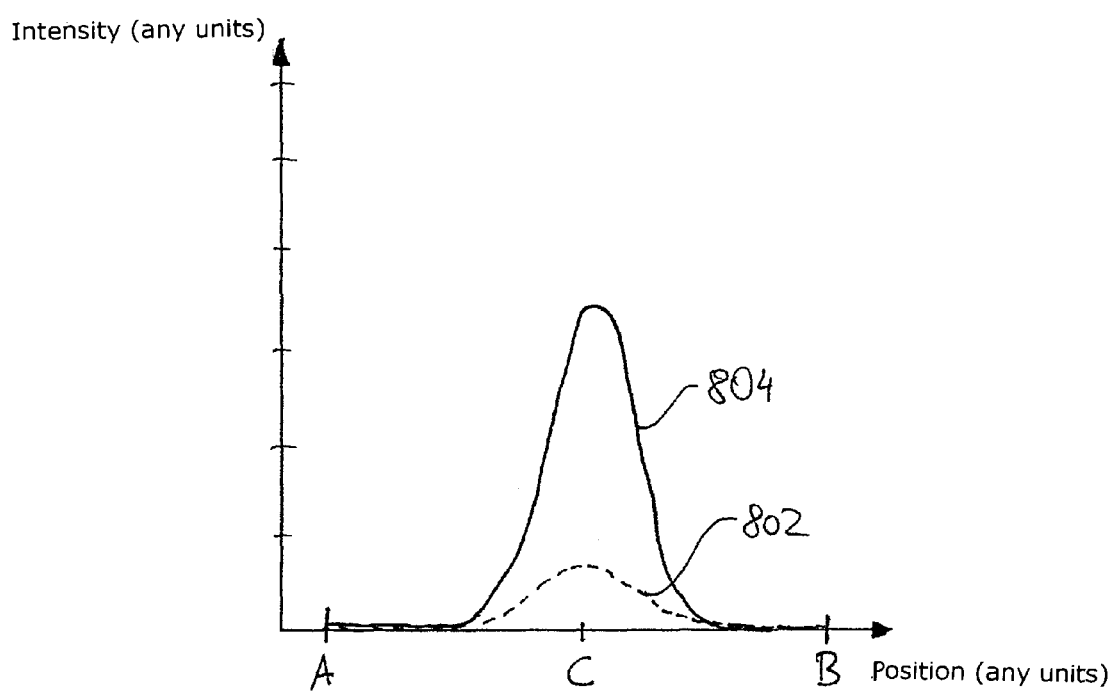
FIG. 8 shows a diagram with a schematic view of the dependency of light intensity on the position when scanning a cross-sectional surface of an embodiment as shown in FIG. 6 or FIG. 7 by means of a cathodoluminescence measurement structure.

FIG. 8 shows a diagram with a schematic view of the dependency of the light intensity on the position when scanning a cross-sectional surface of an embodiment as shown in FIG. 6 or FIG. 7 by means of a cathodoluminescence measurement structure. The FIG. 8 diagram shows the dependency of the intensity of cathodoluminescence (plotted in any linear units) in dependence on the position of the electron beam probe which excites the luminescence and which on the x-axis is also shown in any units. The scanning direction, for the measurement shown in FIG. 8, was effected along a side surface which extends perpendicularly to the plane of the paper in the examples of FIGS. 6 and 7. The beginning and end of the scanning operation are shown by way of example in FIGS. 6 and 7 as positions A and B and are equally reproduced on the x-axis in FIG. 8. A first curve 802 was measured with a value of the operating voltage of $U_F$=0 V. The curve 804 shown by a solid line was measured with a value of the operating voltage $U_F$ of 2 V. A similar intensity pattern is also to be found in the example of FIG. 6, but in that case measurement is always effected with the forward polarity of the voltage $U_F$ and the two curves 802 and 804 correspond to the bias voltage values $U_{BIAS}$=0 V (curve 802) and $U_{BIAS}$=3 V (curve 804). The measurement result diagrammatically reproduced here shows that the intensity of light emission from the dislocation region at the position C of the dislocation network when a bias voltage is applied is markedly higher than when there is no bias voltage.

What is claimed is:

1. A light-emitting semiconductor component comprising a substrate which has a first interface between a first and a second silicon layer, whose lattice structures are rotated relative to each other through a twist angle about a first axis perpendicular to the substrate surface and are tilted through a tilt angle about a second axis parallel to the substrate surface, in such a way that a dislocation network is present in the region of the interface, characterized in that the twist angle and the tilt angle are so selected that an electroluminescence spectrum of the semiconductor component has an absolute maximum of the emitted light intensity at either 1.3 micrometers light wavelength or 1.55 micrometers light wavelength.

2. A light-emitting semiconductor component as set forth in claim 1 wherein the twist angle is between 1.1° and 1.5° and the tilt angle is between 0.6° and 0.7°.

3. A light-emitting semiconductor component as set forth in claim 2 wherein the twist angle is 1.3°.

4. A light-emitting semiconductor component as set forth in claim 2 wherein the tilt angle is 0.64°.

5. A light-emitting semiconductor component as set forth in claim 1 wherein the twist angle is between 8.9° and 9.1° and the tilt angle is between 0.1° and 0.3°.

6. A light-emitting semiconductor component as set forth in claim 5 wherein the twist angle is 9.0°.

7. A light-emitting semiconductor component as set forth in claim 1 wherein the tilt angle is 0.2°.

8. A light-emitting semiconductor component as set forth in claim 1 wherein the twist angle is between 8.1° and 8.3° and the tilt angle is between 0.1° and 0.3°.

9. A light-emitting semiconductor component as set forth in claim 4 wherein the twist angle is 8.2°.

10. A light-emitting semiconductor component as set forth in claim 1 wherein the tilt angle is 0.2°.

11. A light-emitting semiconductor component as set forth in claim 1 wherein the first and second silicon layers are formed by two silicon wafers with (100)-surfaces which are connected together by means of a wafer bonding process.

12. A light-emitting semiconductor component as set forth in claim 1 wherein the second axis is either parallel or approximately parallel to a <110>-direction of the wafer.

13. A light-emitting semiconductor component as set forth in claim 1 wherein the first interface is arranged between 100 and 300 nm beneath the substrate surface.

14. A light-emitting semiconductor component as set forth in claim 1 wherein the first interface is at a spacing of more than 200 nm from the substrate surface.

15. A light-emitting semiconductor component as set forth in claim 1 wherein the second silicon layer at its side remote from the first silicon layer forms with a third silicon layer a second interface at which the second and third silicon layers are rotated relative to each other through a second twist angle and are tilted through a second tilt angle, in such a way that a dislocation network is present in the region of the second interface, wherein the second twist angle and the second tilt angle are so selected that an electroluminescence spectrum of the semiconductor component from the region of the second dislocation network has an absolute maximum of the emitted light intensity at either 1.3 micrometers light wavelength or 1.55 micrometers light wavelength.

16. A light-emitting semiconductor component as set forth in claim 15 wherein the second twist angle is between 1.1° and 1.5° and the second tilt angle is of 0.6° and 0.7°, or the second twist angle is between 8.9° and 9.1° and the second tilt angle is between 0.1° and 0.3°, or the second twist angle is between 8.1° and 8.3° and the second tilt angle is between 0.1° and 0.3°.

17. A light-emitting semiconductor component as set forth in claim 1 comprising an n-doped portion and a p-doped portion adjoining same, which are so arranged relative to the first interface or the first and second interfaces that the dislocation network or networks lie outside a barrier layer formed upon forward polarity of the semiconductor component.

18. A light-emitting semiconductor component as set forth in claim 1 comprising an n-doped portion and a p-doped portion adjoining same, which are so arranged relative to the first interface or the first and second interfaces that the dislocation network or networks lie within a barrier layer formed upon forward polarity of the semiconductor component.

19. A light-emitting semiconductor component as set forth in claim 1 which is in the form of a light-emitting diode.

20. A light-emitting semiconductor component as set forth in claim 1 which is in the form of a laser diode.

21. A light-emitting semiconductor component as set forth in claim 1 wherein the substrate surface has at least two surface portions of which first a surface portion is disposed on a first side of the first interface and a second surface portion is disposed on a second side of the first interface, and wherein at least one respective contact element is arranged on the first and second surface portions.

22. A light-emitting semiconductor component as set forth in claim 21 wherein the contact elements are ohmic contact elements.

23. Use of a silicon substrate which has a first interface between a first and a second silicon layer, whose lattice structures are rotated relative to each other through a twist angle about a first axis perpendicular to the substrate surface and are tilted through a tilt angle about a second axis parallel to the substrate surface, in such a way that a dislocation network is present in the region of the interface, wherein the twist angle and the tilt angle are so selected that an electroluminescence spectrum of the semiconductor component has an absolute maximum of the emitted light intensity at either 1.3 micrometers light wavelength or 1.55 micrometers light wavelength, for the production of a light-emitting semiconductor component.

* * * * *